United States Patent
Hiyoshi et al.

(10) Patent No.: US 9,425,263 B2
(45) Date of Patent: Aug. 23, 2016

(54) SILICON CARBIDE SEMICONDUCTOR DEVICE AND METHOD FOR MANUFACTURING SAME

(71) Applicant: Sumitomo Electric Industries, Ltd., Osaka-shi (JP)

(72) Inventors: Toru Hiyoshi, Osaka (JP); Kosuke Uchida, Osaka (JP); Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/803,868

(22) Filed: Jul. 20, 2015

(65) Prior Publication Data

US 2015/0325657 A1    Nov. 12, 2015

Related U.S. Application Data

(62) Division of application No. 13/925,339, filed on Jun. 24, 2013, now Pat. No. 9,147,731.

(60) Provisional application No. 61/680,519, filed on Aug. 7, 2012.

(30) Foreign Application Priority Data

Aug. 7, 2012    (JP) .................................. 2012-174724

(51) Int. Cl.
*H01L 21/20*    (2006.01)
*H01L 29/06*    (2006.01)
(Continued)

(52) U.S. Cl.
CPC .......... *H01L 29/1608* (2013.01); *H01L 21/049* (2013.01); *H01L 21/0445* (2013.01);
(Continued)

(58) Field of Classification Search
CPC .................. H01L 21/02167; H01L 21/02378; H01L 21/02447; H01L 21/02529; H01L 29/1608; H01L 21/3148

USPC .................. 257/43, 392, 77, 775, 76, 49, 57, 257/E21.576, E21.585, E21.337, E21.345, 257/E29.066, E29.118, E29.136, E21.634, 257/E21.638, E21.639, E27.016, E21.66, 257/E21.682, E21.688, E27.103; 438/43, 438/392, 77, 775, 76, 49, 57

See application file for complete search history.

(56) References Cited

U.S. PATENT DOCUMENTS

| 2005/0017272 A1 | 1/2005 | Yamashita et al. |
| 2008/0233285 A1* | 9/2008 | Das .................. H01L 21/02236 427/248.1 |

(Continued)

FOREIGN PATENT DOCUMENTS

| CA | 2786238 A1 | 9/2011 |
| CN | 1599961 A | 3/2005 |

(Continued)

OTHER PUBLICATIONS

Notice of Grounds of Rejection for Japanese Patent Application No. 2012-174724, dated Jul. 14, 2015.

(Continued)

*Primary Examiner* — Julio J Maldonado
*Assistant Examiner* — Moin Rahman
(74) *Attorney, Agent, or Firm* — Venable LLP; Michael A. Sartori

(57) ABSTRACT

A method for manufacturing a silicon carbide semiconductor device includes the following steps. A silicon carbide substrate is prepared. A first heating step of heating the silicon carbide substrate in an atmosphere of oxygen is performed. A second heating step of heating the silicon carbide substrate to a temperature of 1300° C. or more and 1500° C. or less in an atmosphere of gas containing nitrogen atoms or phosphorus atoms is performed after the first heating step. A third heating step of heating the silicon carbide substrate in an atmosphere of a first inert gas is performed after the second heating step. Thus, the silicon carbide semiconductor device in which threshold voltage variation is small, and a method for manufacturing the same can be provided.

4 Claims, 8 Drawing Sheets

(51) Int. Cl.

| | |
|---|---|
| *H01L 29/16* | (2006.01) |
| *H01L 29/51* | (2006.01) |
| *H01L 21/263* | (2006.01) |
| *H01L 21/04* | (2006.01) |
| *H01L 29/66* | (2006.01) |
| *H01L 29/739* | (2006.01) |
| *H01L 29/78* | (2006.01) |
| *H01L 29/34* | (2006.01) |
| *H01L 29/04* | (2006.01) |

(52) U.S. Cl.
CPC ............ *H01L21/2636* (2013.01); *H01L 29/51* (2013.01); *H01L 29/66068* (2013.01); *H01L 29/7395* (2013.01); *H01L 29/7802* (2013.01); *H01L 29/045* (2013.01); *H01L 29/34* (2013.01)

(56) References Cited

U.S. PATENT DOCUMENTS

| | | |
|---|---|---|
| 2011/0186862 A1 | 8/2011 | Harada et al. |
| 2012/0018743 A1 | 1/2012 | Hiyoshi et al. |
| 2012/0175638 A1 | 7/2012 | Hiyoshi et al. |
| 2012/0223330 A1 | 9/2012 | Dhar et al. |
| 2012/0241767 A1 | 9/2012 | Yano et al. |

FOREIGN PATENT DOCUMENTS

| | | |
|---|---|---|
| CN | 101283439 A | 10/2008 |
| EP | 1463121 A1 | 9/2004 |
| EP | 1 981 076 A1 | 10/2008 |
| JP | 2005-116893 A | 4/2005 |
| JP | 2009-509338 A | 3/2009 |
| JP | 2009-158933 A | 7/2009 |
| JP | 2012-049491 A | 3/2012 |
| JP | 2012-146798 A | 8/2012 |
| WO | WO-2007/026622 A1 | 3/2007 |
| WO | WO-2007/035304 A1 | 3/2007 |
| WO | WO-2011/074237 A1 | 6/2011 |

OTHER PUBLICATIONS

Mitsuo Okamoto et al., "Reduction of instability in Vth of 4H-SiC C-face MOSFETs," Proceedings of the 59th Spring Meeting of The Japan Society of Applied Physics and Related Societies (2012, Waseda University), 15-309.

International Search Report and Written Opinion in PCT International Application No. PCT/JP2013/066704, dated Sep. 17, 2013.

Dai Okamoto et al., "Improved Inversion Channel Mobility in 4H-SiC MOSFETs on Si Face Utilizing Phosphorus-Doped Gate Oxide," IEEE Electron Device Letters, vol. 31, No. 7, Jul. 2010, pp. 710-712.

Extended European Search Report in European Patent Application No. 13827817.1, dated Mar. 18, 2016.

Notification of First Office Action in Chinese Patent Application No. 201380036253.8, dated May 5, 2016.

\* cited by examiner

SILICON CARBIDE SEMICONDUCTOR DEVICE AND METHOD FOR MANUFACTURING SAME

CROSS REFERENCE TO RELATED APPLICATIONS

This application is a Divisional of U.S. patent application Ser. No. 13/925,339, filed Jun. 24, 2013, which claims the benefit of U.S. Provisional Patent Application No. 61/680,519, filed Aug. 7, 2012 and Japanese Patent Application No. 2012-174724, filed Aug. 7, 2012.

BACKGROUND OF THE INVENTION

1. Field of the Invention

The present invention relates to silicon carbide semiconductor devices and methods for manufacturing the same, and more particularly to a silicon carbide semiconductor device capable of suppressing threshold voltage variation and a method for manufacturing the same.

2. Description of the Background Art

In recent years, silicon carbide has been increasingly employed as a material for a semiconductor device in order to allow a higher breakdown voltage, lower loss and the use in a high-temperature environment and the like of the semiconductor device. Silicon carbide is a wide band gap semiconductor having a band gap wider than that of silicon which has been conventionally and widely used as a material for a semiconductor device. By employing the silicon carbide as a material for a semiconductor device, therefore, a higher breakdown voltage, lower on-resistance and the like of the semiconductor device can be achieved. A semiconductor device made of silicon carbide also has the advantage of exhibiting less performance degradation when used in a high-temperature environment than a semiconductor device made of silicon.

Among the semiconductor devices made of silicon carbide, in a MOSFET (Metal Oxide Semiconductor Field Effect Transistor) and an IGBT (Insulated Gate Bipolar Transistor), for example, an electric current can be passed and interrupted between two electrodes by controlling the presence or absence of formation of an inversion layer in a channel region based on a prescribed threshold voltage.

For example, Mitsuo Okamoto et al., "Reduction of instability in $V_{th}$ of 4H—SiC C-face MOSFETs," Proceedings of the 59th Spring Meeting of The Japan Society of Applied Physics and Related Societies (2012 Waseda University), 15-309 (Non-Patent Document 1) points out that a threshold voltage varies with gate bias stress in a silicon carbide MOSFET. In order to reduce variation in the threshold voltage, Non-Patent Document 1 discloses a method of annealing a silicon carbide substrate having a gate oxide film formed thereon in a hydrogen atmosphere.

However, if annealing is performed in a hydrogen atmosphere, even if the threshold voltage variation can be temporarily reduced, it is believed that the effect of the reduction in threshold voltage variation is lost when the substrate is exposed to high temperature in a subsequent step of forming an ohmic electrode, for example. In other words, although the threshold voltage variation is reduced at a stage where a gate electrode is formed on a substrate, it is believed that the threshold voltage variation is not reduced at a stage where a final device is produced.

SUMMARY OF THE INVENTION

The present invention was made to solve such problems, and an object of the present invention is to provide a silicon carbide semiconductor device in which threshold voltage variation is small, and a method for manufacturing the same.

The present inventors conducted a detailed study of methods of suppressing threshold voltage variation by gate bias stress, and arrived at the present invention based on the following findings. First, a mechanism of threshold voltage variation is described. Referring to FIG. 2, when a gate oxide film 91 made of silicon dioxide is formed on a p type body region 4 of a silicon carbide substrate, traps 8 are formed at an interface between p type body region 4 of the silicon carbide substrate and gate oxide film 91. Traps 8 refer to an interface state formed between p type body region 4 of the silicon carbide substrate and gate oxide film 91.

Referring to FIG. 3, when a transistor is operated, electrons 9 flowing through a channel formed in p type body region 4 are captured in traps 8. Captured electrons 9 cannot contribute to electrical conduction. In addition, captured electrons 9 behave as fixed charges. Electrons 9 have a negative charge and therefore cancel a positive gate voltage. This shifts the threshold voltage to the positive side. It is believed that the threshold voltage varies in this manner.

As described above, it is believed that the presence of traps 8 is a main factor for the threshold voltage variation. To reduce the threshold voltage variation, therefore, the trap density (interface state density) needs to be reduced. To reduce the trap density, it is effective to raise an annealing temperature when oxidizing the silicon carbide substrate. As a result of detailed study, the inventors found that the trap density is saturated at an oxidation temperature of about 1300° C., and that the trap density is not greatly reduced at a higher temperature.

It is believed that traps 8 originate from dangling bonds at the interface between the silicon carbide and the silicon dioxide. To reduce traps 8, the dangling bonds need to be reduced. When a silicon carbide substrate having a silicon dioxide layer formed thereon is annealed in an atmosphere containing nitrogen (N) atoms or phosphorus (P) atoms, the nitrogen atoms or phosphorus atoms are bonded to the dangling bonds. As a result, the dangling bonds bonded to the nitrogen atoms or phosphorus atoms cannot trap the electrons, thus substantially reducing the trap density. In addition, when the annealing temperature is 1300° C. or more, the nitrogen atoms or phosphorus atoms can be effectively bonded to the dangling bonds, thus effectively reducing the trap density. Since the softening point of silicon carbide is about 1500° C., it is preferable to perform the annealing at 1500° C. or less.

Hence, a method for manufacturing a silicon carbide semiconductor device according to the present invention includes the following steps. A silicon carbide substrate is prepared. A first heating step of heating the silicon carbide substrate in an atmosphere of oxygen is performed. A second heating step of heating the silicon carbide substrate to a temperature of 1300° C. or more and 1500° C. or less in an atmosphere of gas containing nitrogen atoms or phosphorus atoms is performed after the first heating step. A third heating step of heating the silicon carbide substrate in an atmosphere of a first inert gas is performed after the second heating step.

According to the method for manufacturing a silicon carbide semiconductor device of the present invention, the second heating step of heating the silicon carbide substrate to a temperature of 1300° C. or more and 1500° C. or less in an atmosphere of gas containing nitrogen atoms or phosphorus atoms is performed after the first heating step. By heating the silicon carbide substrate to 1300° C. or more in the atmosphere of gas containing nitrogen atoms or phosphorus atoms, the density of traps formed at an interface between the silicon carbide substrate and a silicon dioxide layer can be effectively reduced. Therefore, the silicon carbide semiconductor device in which threshold voltage variation is small can be obtained. Moreover, since the heating temperature is 1500° C. or less, the softening of the silicon carbide substrate can be suppressed.

Preferably, in the above method for manufacturing a silicon carbide semiconductor device, in the third heating step, the silicon carbide substrate is heated to 1300° C. or more and 1500° C. or less. By heating the silicon carbide substrate to 1300° C. or more, the redundant gas containing nitrogen atoms or phosphorus atoms that has been introduced in the silicon dioxide layer can be efficiently diffused to the outside from the silicon dioxide layer. As a result, the threshold voltage can be shifted to the positive side, thereby making the silicon carbide semiconductor device of normally off type. Moreover, since the heating temperature is 1500° C. or less, the softening of the silicon carbide substrate can be suppressed.

Preferably, in the above method for manufacturing a silicon carbide semiconductor device, in the first heating step, the silicon carbide substrate is heated to 1300° C. or more and 1500° C. or less. The trap density can be minimized when the temperature of the silicon carbide substrate is 1300° C. or more. Moreover, since the heating temperature is 1500° C. or less, the softening of the silicon carbide substrate can be suppressed.

Preferably, in the above method for manufacturing a silicon carbide semiconductor device, the oxygen is replaced by a second inert gas after the first heating step and before the second heating step. Thus, the oxygen can be effectively removed, whereby the oxidation of the silicon carbide substrate with remaining oxygen can be suppressed.

Preferably, in the above method for manufacturing a silicon carbide semiconductor device, the first inert gas is one of argon gas, helium gas and nitrogen gas. Thus, the gas containing nitrogen atoms or phosphorus atoms that has been introduced in the silicon dioxide layer in the second step can be effectively diffused to the outside of the silicon dioxide layer.

Preferably, in the above method for manufacturing a silicon carbide semiconductor device, the gas containing nitrogen atoms is one of nitrogen monoxide, dinitrogen monoxide, nitrogen dioxide and ammonia. Thus, the density of traps formed between the silicon carbide substrate and the silicon dioxide layer can be effectively reduced.

Preferably, in the above method for manufacturing a silicon carbide semiconductor device, the gas containing phosphorus atoms is phosphoryl chloride ($POCl_3$). Thus, the density of traps formed between the silicon carbide substrate and the silicon dioxide layer can be effectively reduced.

A silicon carbide semiconductor device according to the present invention includes a silicon carbide substrate, an oxide film, a gate electrode, a first electrode and a second electrode. The oxide film is arranged in contact with the silicon carbide substrate. The gate electrode is arranged in contact with the oxide film such that the oxide film is interposed between the gate electrode and the silicon carbide substrate. The first electrode and the second electrode are arranged in contact with the silicon carbide substrate. The first electrode and the second electrode are configured such that a current flowing between the first electrode and the second electrode can be controlled by a gate voltage applied to the gate electrode. The difference between a first threshold voltage of the silicon carbide semiconductor device that is measured for the first time and a second threshold voltage of the silicon carbide semiconductor device that is measured after stress has been applied to the silicon carbide semiconductor device continuously for 1000 hours is within ±0.2 V. The application of the stress is applying the gate voltage of 45 kHz varying from −5 V to +15 V to the gate electrode, with the voltage of the first electrode being 0 V and the voltage of the second electrode being 0 V. Thus, the silicon carbide semiconductor device in which threshold voltage variation is small can be obtained.

Referring now to FIGS. 4 and 5, the definition of threshold voltage is described. Referring to FIG. 4, first, a drain current ($I_d$) is measured by varying a gate voltage ($V_g$). The drain current hardly flows when the gate voltage is negative, and suddenly starts flowing as the gate voltage is increased. A threshold voltage ($V_{th}$) refers to the gate voltage at which the drain current starts flowing. More specifically, the threshold voltage ($V_{th}$) refers to the gate voltage when the drain voltage is 0.1 V, the source voltage is 0 V, and the drain current is 1 nA. It is noted that a voltage ($V_{ds}$) between source and drain is 0.1 V.

Referring to FIG. 5, threshold voltage variation is now described. First, the drain voltage is measured by varying the gate voltage applied to a silicon carbide semiconductor device. The gate voltage at which the drain current is 1 nA is referred to as a first threshold voltage ($V_{th1}$). Then, stress is applied to the silicon carbide semiconductor device. Subsequently, the drain voltage is varied by varying the gate voltage. The gate voltage at which the drain current is 1 nA is referred to as a second threshold voltage ($V_{th2}$). In this manner, the threshold voltage varies by the application of stress.

Usually, after the completion of a process of manufacturing a silicon carbide semiconductor device, operation checking is performed for shipping inspection, before the silicon carbide semiconductor device is shipped. In the present invention, the first threshold voltage of the silicon carbide semiconductor device that is measured for the first time includes a first threshold voltage measured by applying a voltage to a gate electrode for the first time after the silicon carbide semiconductor device has been shipped.

Preferably, in the above silicon carbide semiconductor device, the difference between the first threshold voltage and a third threshold voltage that is measured after a lapse of any period of time of up to 1000 hours after the start of the application of the stress to the silicon carbide semiconductor device is within ±0.2 V. Thus, the silicon carbide semiconductor device in which threshold voltage variation is small after the lapse of any period of time of up to 1000 hours can be obtained.

Preferably, in the above silicon carbide semiconductor device, the stress is applied at a temperature of 150° C. Thus, the silicon carbide semiconductor device in which threshold voltage variation is small at a high temperature of about 150° C. can be obtained.

Preferably, in the above silicon carbide semiconductor device, the difference between the first threshold voltage and the second threshold voltage is within ±0.2 V when the stress is applied either at room temperature or at a temperature of 150° C. Thus, the silicon carbide semiconductor device in which threshold voltage variation is small both at a high temperature of about 150° C. and at room temperature can be obtained.

As is clear from the description above, according to the present invention, a silicon carbide semiconductor device in which threshold voltage variation is small, and a method for manufacturing the same can be provided.

The foregoing and other objects, features, aspects and advantages of the present invention will become more appar-

DESCRIPTION OF THE PREFERRED EMBODIMENTS

Figure 1:
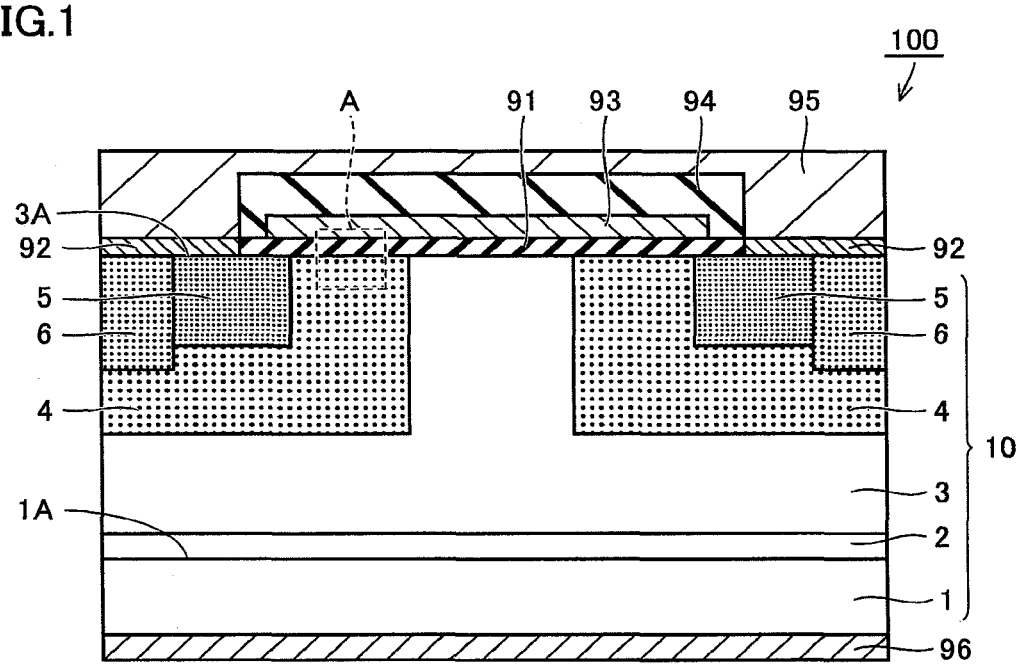
FIG. 1 is a schematic cross-sectional view showing the structure of a silicon carbide semiconductor device according to one embodiment of the present invention.

The embodiments of the present invention will be described hereinafter with reference to the drawings, in which the same or corresponding components are designated by the same reference numerals, and description thereof will not be repeated. Regarding crystallographic descriptions in the present specification, an individual orientation is represented by [ ], a group orientation is represented by < >, an individual plane is represented by ( ) and a group plane is represented by { }. In addition, although a negative index is crystallographically indicated by putting "-" (bar) above a numeral, it is indicated by putting a negative sign before the numeral in the present specification. Furthermore, angles are described using a system having an omni-directional angle of 360 degrees.

Referring to FIG. 1, a MOSFET 100 which is a silicon carbide semiconductor device in this embodiment mainly includes a silicon carbide substrate 10, a gate oxide film 91, a gate electrode 93, a source contact electrode 92 (first electrode), and a drain electrode 96 (second electrode).

Silicon carbide substrate 10 is made of hexagonal silicon carbide of polytype 4H, for example. Silicon carbide substrate 10 includes a main surface 3A which is the (0001) plane, for example. Main surface 3A may have an off angle of about 8° relative to the (0001) plane, for example, and may be the (0-33-8) plane. Preferably, main surface 3A macroscopically has an off angle of 62°±10° relative to the {000-1} plane.

Silicon carbide substrate 10 includes a substrate 1 made of silicon carbide of n conductivity type (first conductivity type), a buffer layer 2 made of silicon carbide of n conductivity type, a drift layer 3 made of silicon carbide of n conductivity type, a pair of p type body regions 4 of p conductivity type (second conductivity type), $n^+$ regions 5 of n conductivity type, and $p^+$ regions 6 of p conductivity type.

Buffer layer 2 is formed on one main surface 1A of substrate 1, and is of n conductivity type by containing an n type impurity. Drift layer 3 is formed on buffer layer 2, and is of n conductivity type by containing an n type impurity. The n type impurity contained in drift layer 3 is nitrogen (N), for example, and is contained in a concentration (density) lower than that of the n type impurity contained in buffer layer 2. The nitrogen concentration in drift layer 3 is about $5 \times 10^{15}$ $cm^{-3}$, for example. Buffer layer 2 and drift layer 3 constitute an epitaxially grown layer formed on one main surface 1A of substrate 1.

P type body regions 4 of the pair are formed separately from each other in the epitaxially grown layer, and are of p conductivity type by containing a p type impurity (impurity of p conductivity type). The p type impurity contained in p type body regions 4 is aluminum (Al) or boron (B), for example. The aluminum or boron concentration in p type body regions 4 is about $1 \times 10^{17}$ $cm^{-3}$, for example.

Each of $n^+$ regions 5 is formed within each of p type body regions 4 of the pair to include main surface 3A and to be surrounded by p type body region 4. $N^+$ regions 5 contain an n type impurity, for example, phosphorus (P), in a concentration (density) higher than that of the n type impurity contained in drift layer 3. The phosphorus concentration in $n^+$ regions 5 is about $1 \times 10^{20}$ $cm^{-3}$, for example.

Each of $p^+$ regions 6 is formed within each of p type body regions 4 of the pair to include main surface 3A, to be surrounded by p type body region 4, and to be adjacent to each of $n^+$ regions 5. $P^+$ regions 6 contain a p type impurity, for example, Al, in a concentration (density) higher than that of the p type impurity contained in p type body regions 4. The Al concentration in $p^+$ regions 6 is about $1 \times 10^{20}$ $cm^{-3}$, for example.

Gate oxide film 91 is arranged on and in contact with silicon carbide substrate 10. Gate oxide film 91 is formed on main surface 3A of the epitaxially grown layer to extend from an upper surface of one of $n^+$ regions 5 to an upper surface of the other $n^+$ region 5, and is made of silicon dioxide, for example.

Gate electrode 93 is arranged in contact with gate oxide film 91 to extend from the upper surface of one of $n^+$ regions 5 to the upper surface of the other $n^+$ region 5. Gate electrode 93 is arranged in contact with gate oxide film 91 such that gate oxide film 91 is interposed between gate electrode 93 and silicon carbide substrate 10. Gate electrode 93 is made of a conductor such as polysilicon or Al doped with an impurity.

Source contact electrode 92 is arranged in contact with $n^+$ regions 5, $p^+$ regions 6 and gate oxide film 91. Source contact electrode 92 is made of a material such as NiSi (nickel silicide), which is capable of making ohmic contact with $n^+$ regions 5.

Drain electrode 96 is formed in contact with a main surface of substrate 1 opposite to the side on which drift layer 3 is formed. Drain electrode 96 is made of a material such as NiSi which is capable of making ohmic contact with n type substrate 1, and is electrically connected to substrate 1.

Source contact electrode 92 (first electrode) and drain electrode 96 (second electrode) are configured such that a current flowing between source contact electrode 92 and drain electrode 96 can be controlled by a gate voltage applied to gate electrode 93.

An interlayer insulating film 94 is formed to be in contact with gate oxide film 91 and to surround gate electrode 93. Interlayer insulating film 94 is made of silicon dioxide which is an insulator, for example.

A source line 95 surrounds interlayer insulating film 94 and extends to an upper surface of source contact electrode 92 on main surface 3A of drift layer 3. Source line 95 is made of a conductor such as Al, and is electrically connected to $n^+$ regions 5 via source contact electrode 92.

The operation of MOSFET 100 is now described. Referring to FIG. 1, when gate electrode 93 has a voltage lower than a threshold voltage, i.e., in an off state, even if a voltage is applied to drain electrode 96, a pn junction between p type body region 4 and drift layer 3 located immediately below gate oxide film 91 is reverse biased, resulting in a non-conducting state. On the other hand, when a voltage equal to or higher than the threshold voltage is applied to gate electrode 93, an inversion layer is formed in a channel region near a location at which p type body region 4 makes contact with gate oxide film 91. As a result, $n^+$ regions 5 and drift layer 3 are electrically connected to each other, causing a current to flow between source line 95 and drain electrode 96.

The difference between a first threshold voltage of MOSFET 100 that is measured for the first time for MOSFET 100 according to this embodiment and a second threshold voltage of MOSFET 100 that is measured after stress has been applied to MOSFET 100 continuously for 1000 hours is within ±0.2 V. Here, the application of the stress is to apply a gate voltage of 45 kHz varying from −5 V to +15 V to gate electrode 93, with the source voltage of source contact electrode 92 (first electrode) being 0 V and the drain voltage of drain electrode 96 (second electrode) being 0 V. The duty ratio is set to 1:1, for example.

Preferably, the difference between the first threshold voltage and a third threshold voltage that is measured after a lapse of any period of time of up to 1000 hours after the start of the stress application to MOSFET 100 is within ±0.2 V.

The stress may be applied to MOSFET 100 at room temperature, for example, or at a temperature of 150° C., for example. Preferably, the difference between the first threshold voltage and the second threshold voltage is within ±0.2 V when the stress is applied either at room temperature or at a temperature of 150° C.

Referring now to FIGS. 7 to 12, an example of a method for manufacturing MOSFET 100 in the first embodiment is described.

Figure 6:
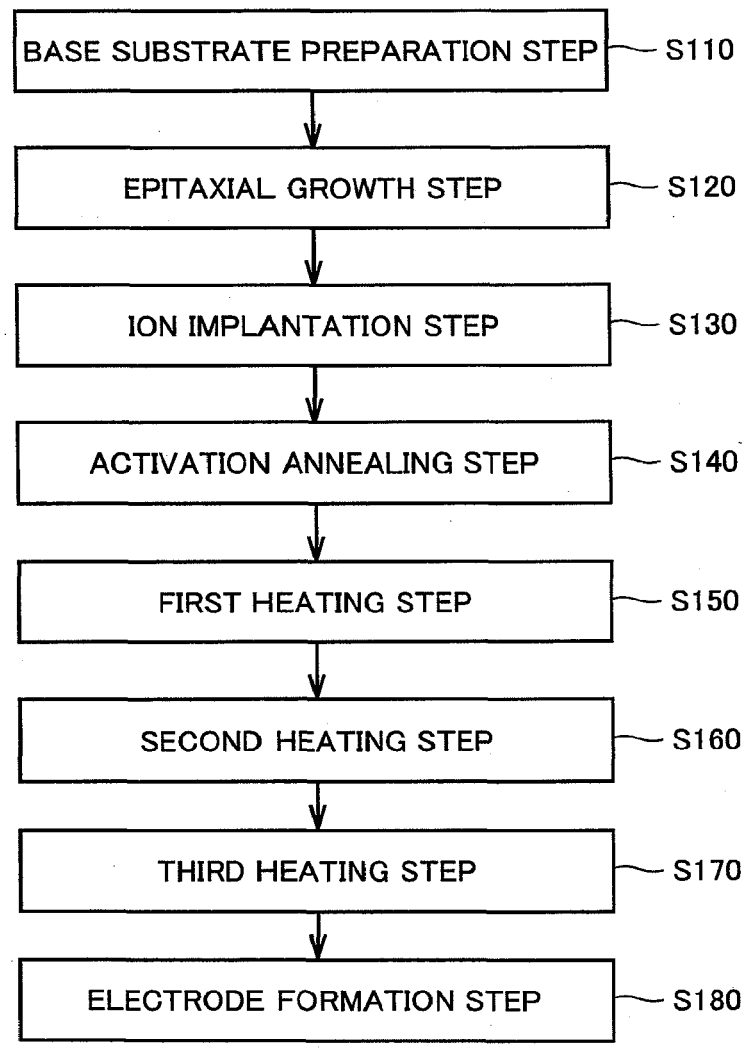
FIG. 6 is a flowchart schematically showing a method for manufacturing a silicon carbide semiconductor device according to one embodiment of the present invention.

In the method for manufacturing MOSFET 100 in this embodiment, a silicon carbide substrate preparation step is performed. The silicon carbide substrate preparation step includes a base substrate preparation step (S110: FIG. 6), an epitaxial growth step (S120: FIG. 6), and an ion implantation step (S130: FIG. 6).

Figure 7:
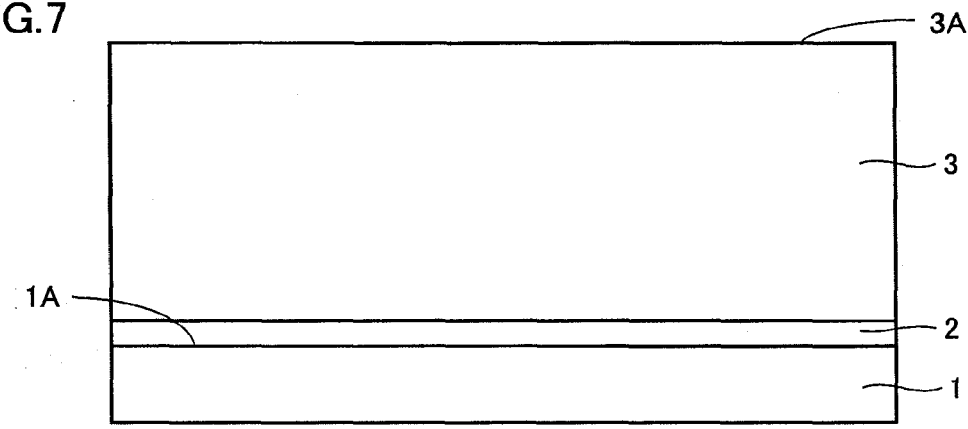
FIG. 7 is a schematic cross-sectional view schematically showing a first step of the method for manufacturing a silicon carbide semiconductor device according to one embodiment of the present invention.
Figure 8:
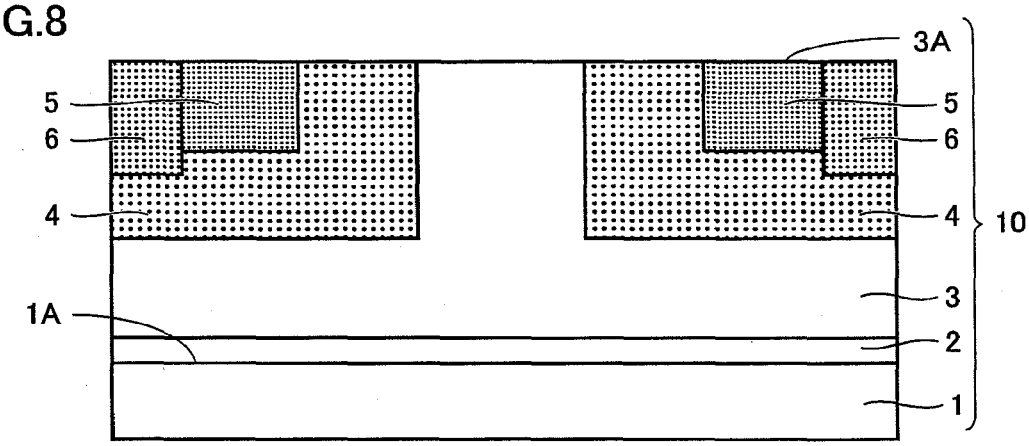
FIG. 8 is a schematic cross-sectional view schematically showing a second step of the method for manufacturing a silicon carbide semiconductor device according to one embodiment of the present invention.
Figure 9:
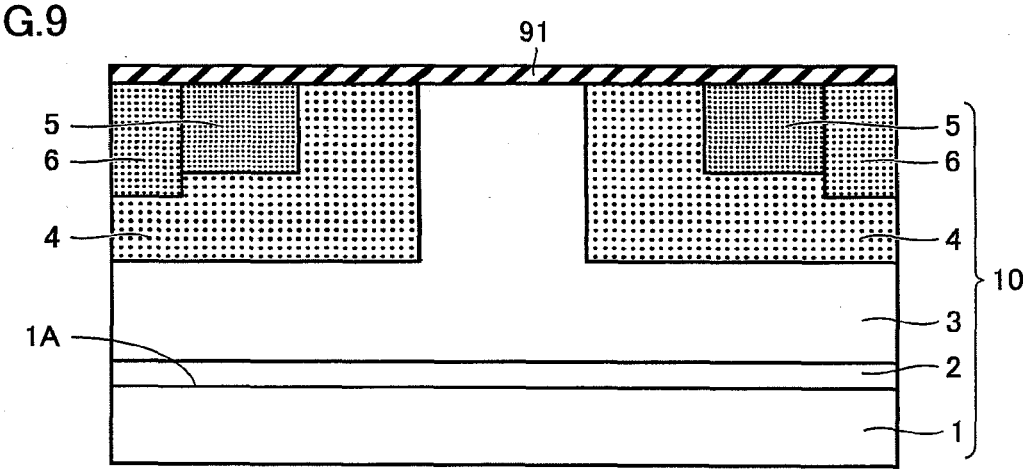
FIG. 9 is a schematic cross-sectional view schematically showing a third step of the method for manufacturing a silicon carbide semiconductor device according to one embodiment of the present invention.

Referring first to FIG. 7, in the step (S110: FIG. 6), base substrate 1 made of single-crystal silicon carbide is prepared.

Next, in the step (S120: FIG. 6), an epitaxial growth step is performed. In this step (S120), buffer layer 2 and drift layer 3 both made of silicon carbide are successively formed by epitaxial growth on one main surface 1A of base substrate 1.

Next, in the step (S130: FIG. 6), an ion implantation step is performed. In this step (S130), referring to FIG. 8, ion implantation for forming p type body regions 4 is performed first. Specifically, Al (aluminum) ions, for example, are implanted into drift layer 3 to form p type body regions 4. Then, ion implantation for forming $n^+$ regions 5 is performed. Specifically, P (phosphorus) ions, for example, are implanted into p type body regions 4 to form $n^+$ regions 5 in p type body regions 4. Then, ion implantation for forming $p^+$ regions 6 is performed. Specifically, Al ions, for example, are implanted into p type body regions 4 to form $p^+$ regions 6 in p type body regions 4. These ion implantations can be performed by forming a mask layer, which is made of silicon dioxide and has an opening in a desired region where the ion implantations are to be performed, in the main surface of drift layer 3, for example.

Thus, silicon carbide substrate 10 including base substrate 1 made of silicon carbide of n conductivity type (first conductivity type), buffer layer 2 made of silicon carbide of n conductivity type, drift layer 3 made of silicon carbide of n conductivity type, p type body regions 4 of p conductivity type (second conductivity type), $n^+$ regions 5 of n conductivity type, and $p^+$ regions 6 of p conductivity type is prepared. Main surface 3A of silicon carbide substrate 10 is the (0001) plane having an off angle of 8°, for example.

Next, in a step (S140: FIG. 6), an activation annealing step is performed. In this step (S140), heat treatment is performed by heating silicon carbide substrate 10 to about 1700° C., for example, in an atmosphere of inert gas such as argon, and holding the substrate for about 30 minutes. Thus, the impurities implanted in the step (S130) are activated.

Next, in a step (S150: FIG. 6), a first heating step is performed. In this step (S150), heat treatment is performed by heating silicon carbide substrate 10 to about 1200° C. or more and about 1300° C. or less, for example, in an atmosphere of oxygen in a concentration of 100%, for example, and holding the substrate for about 60 minutes. Preferably, silicon carbide substrate 10 is heated to about 1300° C. or more and about 1500° C. or less. Thus, gate oxide film 91 made of silicon dioxide is formed on and in contact with silicon carbide substrate 10.

Figure 2:
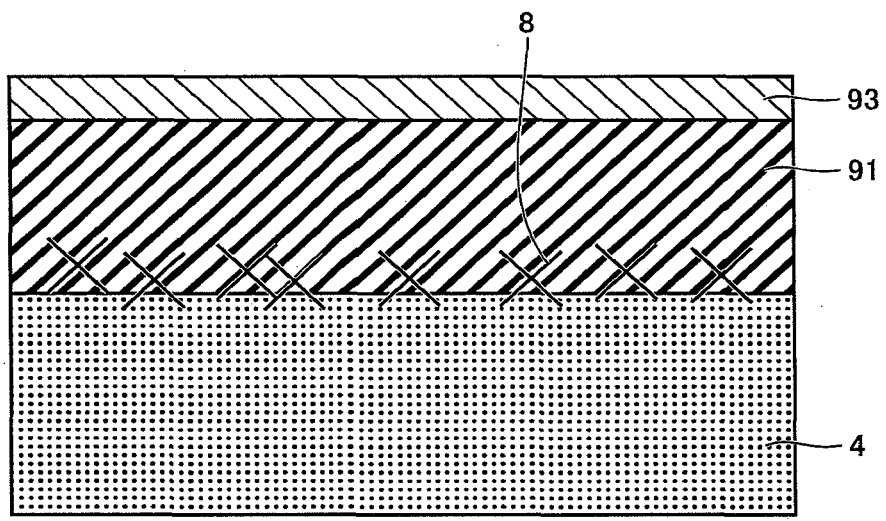
FIG. 2 is a schematic diagram for illustrating traps formed at an interface between a silicon carbide semiconductor substrate and a silicon dioxide layer.
Figure 3:
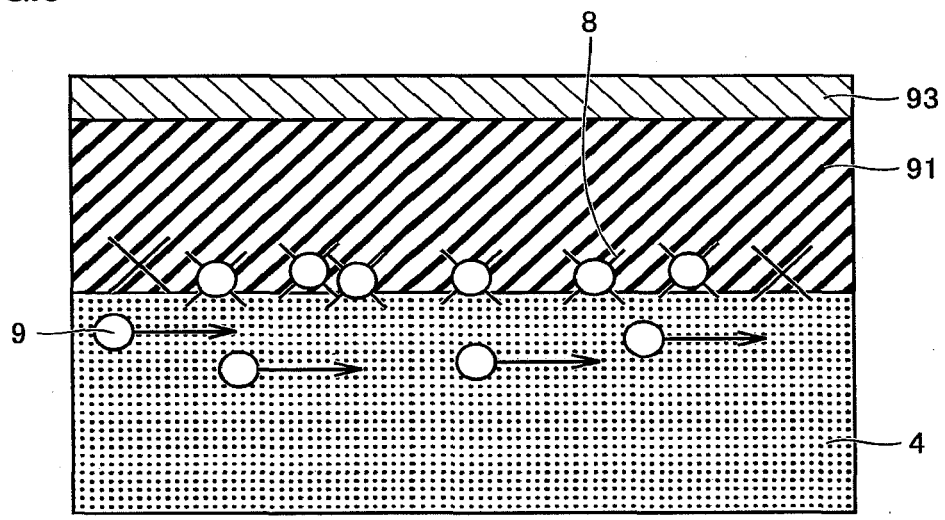
FIG. 3 is a schematic diagram for illustrating a state where electrons are captured in the traps.
Figure 4:
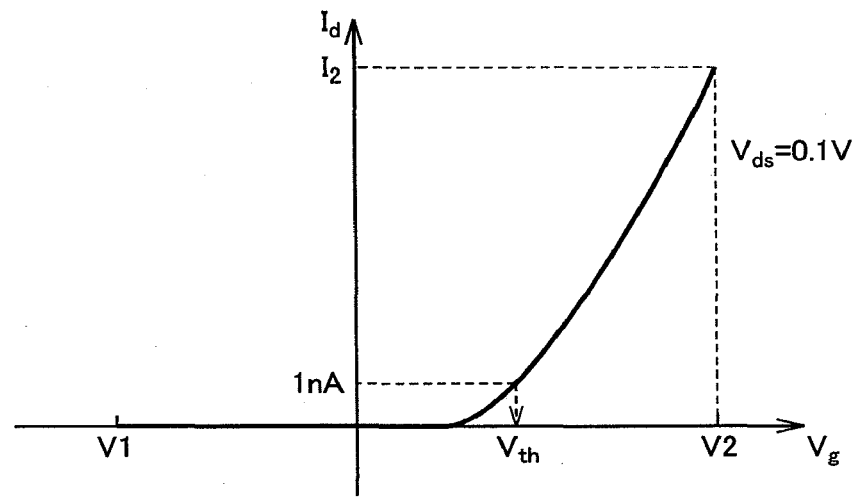
FIG. 4 shows relation between a gate voltage and a drain current.
Figure 5:
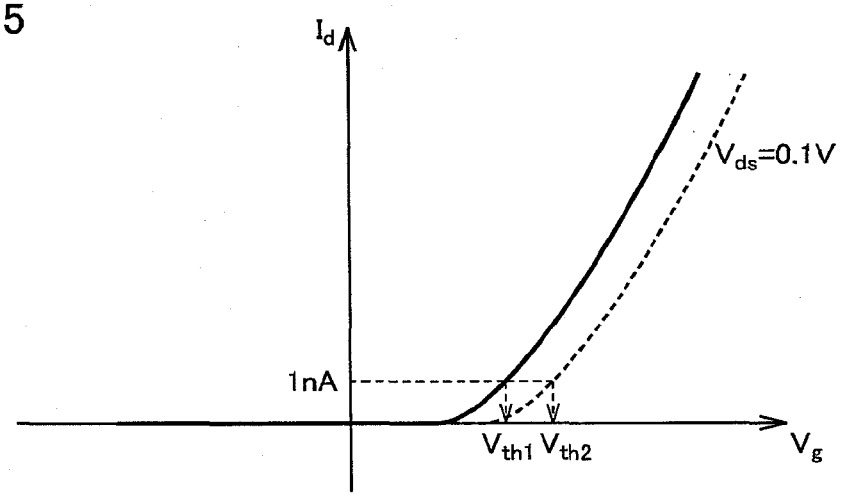
FIG. 5 shows relation between a gate voltage and a drain current.

Next, in a step (S160: FIG. 6), a second heating step is performed. In this step (S160), gas containing nitrogen atoms or phosphorus atoms is used as an atmospheric gas. Examples of the gas containing nitrogen atoms include nitrogen monoxide, dinitrogen monoxide, nitrogen dioxide and ammonia. Examples of the gas containing phosphorus atoms include phosphoryl chloride ($POCl_3$). In this step (S160), silicon carbide substrate 10 is held for one hour, for example, at a temperature of 1300° C. or more and 1500° C. or less in the aforementioned atmospheric gas. By such heat treatment, the nitrogen atoms or phosphorus atoms are captured in traps 8 present in an interface region between gate oxide film 91 and drift layer 3 (see FIGS. 2 and 3). Thus, the formation of an interface state in the interface region between gate oxide film 91 and drift layer 3 is suppressed.

Next, in a step (S170: FIG. 6), a third heating step is performed. In this step (S170), inert gas such as argon or nitrogen (first inert gas) is employed as an atmospheric gas, and heat treatment is performed by heating silicon carbide substrate 10 in this atmospheric gas. In this step (S170), silicon carbide substrate 10 is held for about one hour at a temperature of 1100° C. or more and 1500° C. or less. Preferably, silicon carbide substrate 10 is held at a temperature of 1300° C. or more and 1500° C. or less.

Figure 10:
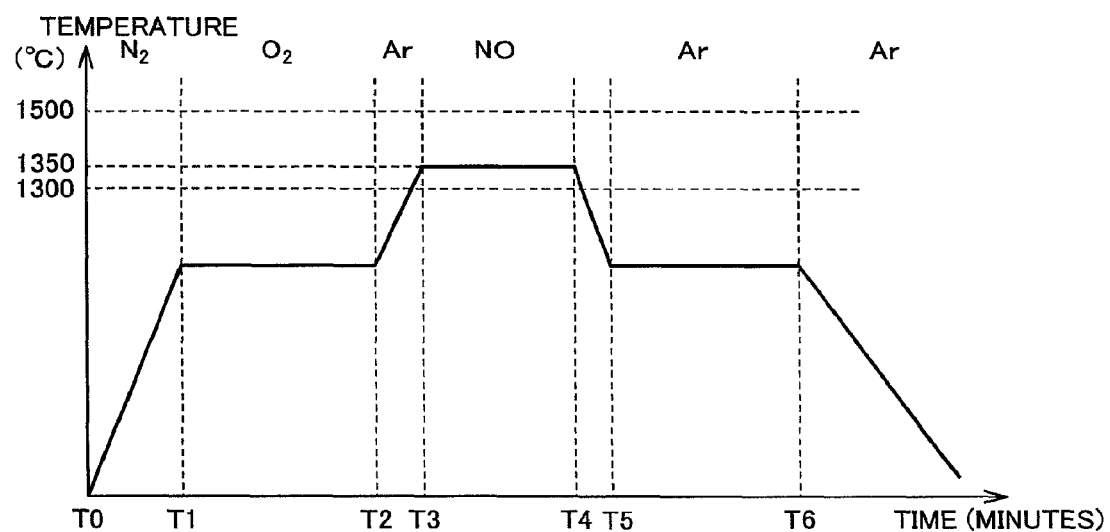
FIG. 10 is a schematic diagram showing relation between temperature and time in an annealing step.
Figure 11:
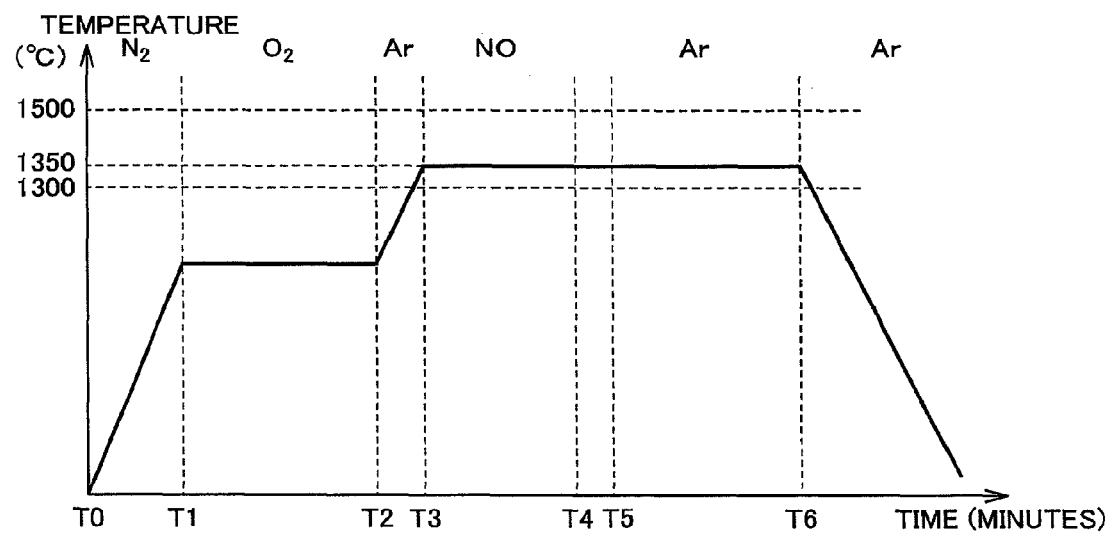
FIG. 11 is a schematic diagram showing relation between temperature and time in an annealing step.
Figure 12:
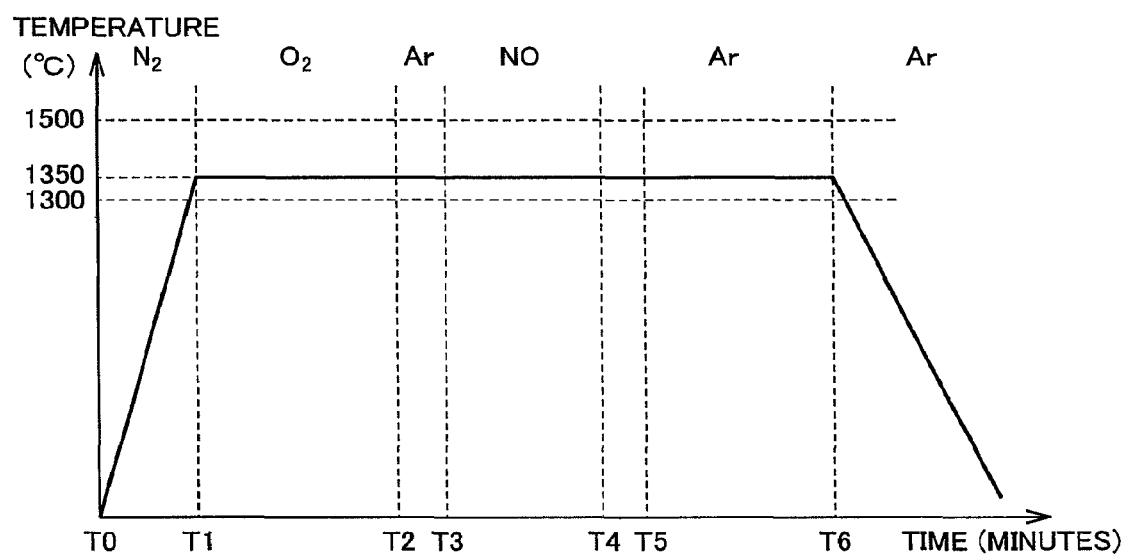
FIG. 12 is a schematic diagram showing relation between temperature and time in an annealing step.

More specifically, the step (S170) to the step (S150) can be performed using temperature profiles such as shown in FIGS. 10 to 12, for example. In FIGS. 10 to 12, the horizontal axis represents a heat treatment period, and the vertical axis represents a heat treatment temperature of silicon carbide substrate 10. In FIGS. 10 to 12, a step between time T1 and time T2 corresponds to the first heating step, a step between time T3 and time T4 corresponds to the second heating step, and a step between time T5 and time T6 corresponds to the third heating step.

Referring to FIG. 10, between time T0 and T1, the temperature of silicon carbide substrate 10 is raised in a nitrogen atmosphere. Silicon carbide substrate 10 is then held at a temperature of less than 1300° C., for example, in an oxygen atmosphere. Subsequently, between time T2 and T3, the temperature of silicon carbide substrate 10 is raised to 1300° C., for example, in an argon gas atmosphere. Preferably, after the first heating step, the oxygen gas is replaced by argon gas (second inert gas) while the temperature of silicon carbide substrate 10 is maintained at a temperature of less than 1300° C., and then silicon carbide substrate 10 is heated to a temperature of 1300° C. or more and 1500° C. or less.

Next, nitrogen monoxide gas is introduced in the furnace, and silicon carbide substrate 10 is heated to a temperature of 1300° C. or more and 1500° C. or less (e.g., about 1350° C.) in a nitrogen monoxide gas atmosphere, and held for a predetermined period of time. Then, the nitrogen monoxide gas in the furnace is replaced by argon gas. Silicon carbide substrate 10 is held at a temperature of 1300° C. or less, for example, in the argon gas atmosphere.

Referring to FIG. 11, in the second heating step (between time T3 and time T4) and the third heating step (between time T5 and time T6), it is preferable to maintain the temperature of silicon carbide substrate 10 at a temperature of about 1300° C. or more and about 1500° C. or less. More preferably, in the second heating step (between time T3 and time T4) and the third heating step (between time T5 and time T6), the temperature of silicon carbide substrate 10 is maintained at a constant temperature of about 1300° C. or more and about 1500° C. or less (e.g., about 1350° C.) for a predetermined period of time. According to this method, there is no need to vary the temperature in the furnace between the second heating step and the third heating step, thereby reducing the total annealing period.

Referring to FIG. 12, in the first heating step (between time T1 and time T2), the second heating step (between time T3 and time T4) and the third heating step (between time T5 and time T6), it is preferable to maintain the temperature of silicon carbide substrate 10 at a temperature of about 1300° C. or more and about 1500° C. or less. More preferably, in the first heating step (between time T1 and time T2), the second heating step (between time T3 and time T4) and the third heating step (between time T5 and time T6), the temperature of silicon carbide substrate 10 is maintained at a constant temperature of about 1300° C. or more and about 1500° C. or less (e.g., about 1350° C.) for a predetermined period of time. According to this method, there is no need to vary the temperature in the furnace between the first heating step and the second heating step and between the second heating step and the third heating step, thereby further reducing the total annealing period.

Next, in a step (S180), an electrode formation step is performed. Referring to FIG. 1, in this step (S180), first, gate electrode 93 made of polysilicon which is a conductor doped with a high concentration of impurity is formed by CVD, photolithography and etching, for example. Then, interlayer insulating film 94 made of silicon dioxide which is an insulator is formed by CVD, for example, to surround gate electrode 93. Then, interlayer insulating film 94 and gate oxide film 91 in a region where source contact electrode 92 is to be formed is removed by photolithography and etching. Then, a nickel (Ni) film formed by evaporation, for example, is heated and silicidized to form source contact electrode 92 and drain electrode 96. Then, source line 95 made of Al which is a conductor is formed on main surface 3A by evaporation, for example, to surround interlayer insulating film 94 and extend to the upper surfaces of n$^+$ regions 5 and source contact electrode 92. Following the above procedure, MOSFET 100 according to this embodiment is completed.

Although the first conductivity type has been described as n type and the second conductivity type as p type in this embodiment, the present invention is not limited to such form. For example, the first conductivity type may be p type and the second conductivity type may be n type.

In addition, although a vertical MOSFET has been described as an example of the silicon carbide semiconductor device in this embodiment, the present invention is not limited to such form. For example, the silicon carbide semiconductor device may be a lateral MOSFET. Alternatively, the MOSFET may be of planar type or trench type. Still alternatively, the silicon carbide semiconductor device may be an IGBT.

The function and effect in this embodiment are now described.

According to the method for manufacturing MOSFET 100 in this embodiment, after the first heating step, the second heating step of heating silicon carbide substrate 10 to a temperature of 1300° C. or more and 1500° C. or less in an atmosphere of gas containing nitrogen atoms or phosphorus atoms is performed. By heating silicon carbide substrate 10 to 1300° C. or more in the atmosphere of gas containing nitrogen atoms or phosphorus atoms, the density of traps formed at an interface between silicon carbide substrate 10 and gate oxide film 91 can be effectively reduced. Therefore, MOSFET 100 in which threshold voltage variation is small can be obtained. Moreover, since the heating temperature is 1500° C. or less, the softening of silicon carbide substrate 10 can be suppressed.

Moreover, according to the method for manufacturing MOSFET 100 in this embodiment, in the third heating step, silicon carbide substrate 10 is heated to 1300° C. or more and 1500° C. or less. By heating silicon carbide substrate 10 to 1300° C. or more, the redundant gas containing nitrogen atoms or phosphorus atoms that has been introduced in gate oxide film 93 can be efficiently diffused to the outside from gate oxide film 93. As a result, the threshold voltage can be shifted to the positive side, thereby making MOSFET 100 of normally off type. Moreover, since the heating temperature is 1500° C. or less, the softening of silicon carbide substrate 10 can be suppressed.

Furthermore, according to the method for manufacturing MOSFET 100 in this embodiment, in the first heating step, silicon carbide substrate 10 is heated to 1300° C. or more and 1500° C. or less. The trap density can be minimized when the temperature of silicon carbide substrate 10 is 1300° C. or more. In addition, plane orientation anisotropy of oxidation rate of silicon carbide substrate 10 is reduced, thereby reducing the roughness of the silicon dioxide layer. Moreover, since the heating temperature is 1500° C. or less, the softening of silicon carbide substrate 10 can be suppressed.

Furthermore, according to the method for manufacturing MOSFET 100 in this embodiment, the oxygen is replaced by argon after the first heating step and before the second heating step. Thus, the oxygen can be effectively removed, whereby the oxidation of silicon carbide substrate 10 with remaining oxygen can be suppressed.

Furthermore, according to the method for manufacturing MOSFET 100 in this embodiment, the first inert gas is one of argon gas, helium gas and nitrogen gas. Thus, the gas containing nitrogen atoms or phosphorus atoms that has been introduced in gate oxide film 91 in the second step can be effectively diffused to the outside of gate oxide film 91.

Furthermore, according to the method for manufacturing MOSFET 100 in this embodiment, the gas containing nitrogen atoms is one of nitrogen monoxide, dinitrogen monoxide, nitrogen dioxide and ammonia. Thus, the density of traps formed between silicon carbide substrate 10 and gate oxide film 91 can be effectively reduced.

Furthermore, according to the method for manufacturing MOSFET 100 in this embodiment, the gas containing phosphorus atoms is phosphoryl chloride ($POCl_3$). Thus, the density of traps formed between silicon carbide substrate 10 and gate oxide film 91 can be effectively reduced.

According to MOSFET 100 in this embodiment, the difference between the first threshold voltage of MOSFET 100 that is measured for the first time and the second threshold voltage of MOSFET 100 that is measured after the stress has been applied to MOSFET 100 continuously for 1000 hours is within ±0.2 V. Thus, MOSFET 100 in which threshold voltage variation is small can be obtained.

Furthermore, according to MOSFET 100 in this embodiment, the difference between the first threshold voltage and the third threshold voltage that is measured after a lapse of any period of time of up to 1000 hours after the start of the stress application to MOSFET 100 is within ±0.2 V. Thus, MOSFET 100 in which threshold voltage variation is small after the lapse of any period of time of up to 1000 hours can be obtained.

Furthermore, according to MOSFET 100 in this embodiment, the stress is applied at a temperature of 150° C. Thus, MOSFET 100 in which threshold voltage variation is small at a high temperature of about 150° C. can be obtained.

Furthermore, according to MOSFET 100 in this embodiment, the difference between the first threshold voltage and the second threshold voltage is within ±0.2 V when the stress is applied either at room temperature or at a temperature of 150° C. Thus, MOSFET 100 in which threshold voltage variation is small both at a high temperature of about 150° C. and at room temperature can be obtained.

EXAMPLE 1

Figure 13:
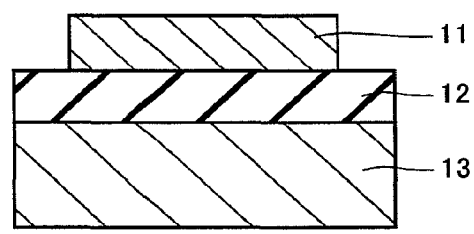
FIG. 13 is a schematic cross-sectional view schematically showing the structure of a MOS diode to examine interface state density.

In this example, relation between the interface state density (trap density) and the oxidation temperature of silicon carbide substrate 10 was examined. First, four types of MOS diodes were prepared for the examination of the interface state density. As shown in FIG. 13, each MOS diode included a silicon carbide substrate 13 having the (0-33-8) plane as a main surface, a silicon dioxide layer 12 formed on silicon carbide substrate 13, and a gate electrode 11 formed on silicon dioxide layer 12.

These four types of MOS diodes were subjected to the first heating step, the second heating step and the third heating step in accordance with the method described in the embodiment. For the MOS diodes of Comparative Example 1 and Comparative Example 2, the temperature in the first heating step (oxidation step) was set to 1100° C. and 1200° C., respectively. For the MOS diodes of Present Invention Example 1 and Present Invention Example 2, the temperature in the first heating step (oxidation step) was set to 1300° C. and 1350° C., respectively. The interface state density was measured with the High-Low method described in Japanese Patent Laying-Open No. 2009-158933.

Figure 14:
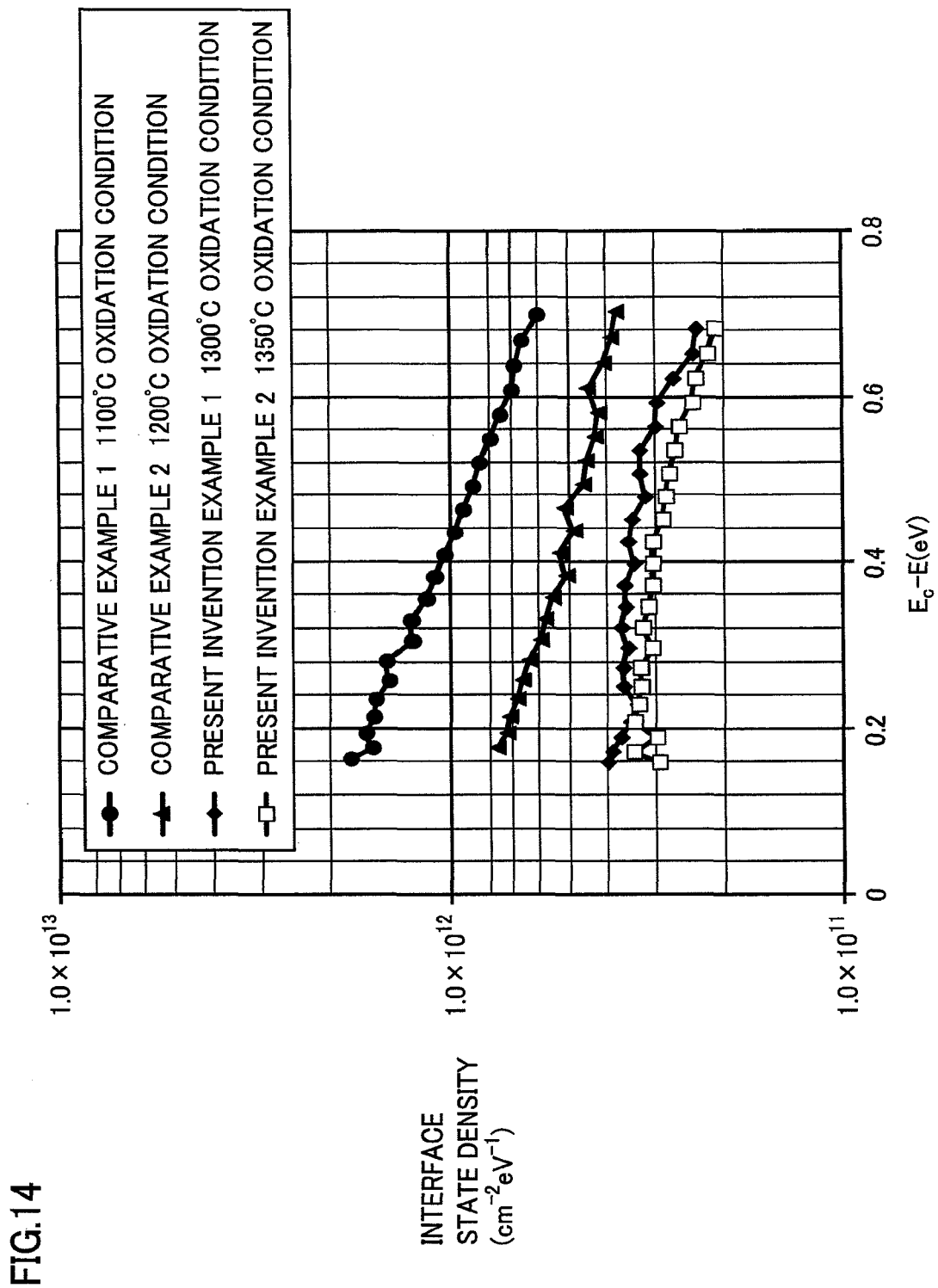
FIG. 14 shows relation between the interface state density and $E_c$–E.

Referring to FIG. 14, the results of the relation between the interface state density and the oxidation temperature is described. In FIG. 14, the vertical axis represents the interface state density, and the horizontal axis represents a value of energy ($E_c$–E) relative to the conduction band.

As shown in FIG. 14, it was confirmed that the interface state density tends to decrease as $E_c$–E increases under all oxidation conditions. It was also confirmed that the interface state density tends to decrease as the oxidation temperature (temperature of silicon carbide substrate 10 in the first heating step) increases. In addition, it was confirmed that the interface state density is saturated at an oxidation temperature of about 1300° C., and that the interface state density does not greatly decrease if the oxidation temperature is further increased.

EXAMPLE 2

In this example, relation between annealing conditions and an amount of variation in threshold voltage was examined. First, a MOSFET according to Comparative Example 3 and a MOSFET according to Present Invention Example 3 were prepared. The MOSFETs according to Comparative Example 3 and Present Invention Example 3 were manufactured in accordance with the method described in the embodiment except for the following points. That is, the (0001) Si plane was employed for main surface 3A of silicon carbide substrate 10. The epitaxial film had a concentration of $7.5\times10^{15}$ $cm^{-3}$. Gate oxide film 91 had a thickness of 45 nm. Gate electrode 93 was made of polysilicon. P type body regions 4 had an impurity concentration of $5\times10^{17}$ $cm^{-3}$.

A gate oxidation step, a nitriding step and an argon annealing step in the process of manufacturing the MOSFET of Comparative Example 3 were performed under the following conditions. That is, in the gate oxidation step (first heating step), silicon carbide substrate 10 was held for 60 minutes at a temperature of 1200° C. or more and 1300° C. or less in an atmosphere of 100% oxygen. In the nitriding step (second heating step), silicon carbide substrate 10 was held for 60 minutes at a temperature of 1100° C. or more and 1200° C. or less in an atmosphere of 100% nitrogen monoxide. In the argon annealing step (third heating step), silicon carbide substrate 10 was held for 60 minutes at a temperature of 1100° C. or more and 1200° C. or less in an atmosphere of 100% argon.

A gate oxidation step, a nitriding step and an argon annealing step in the process of manufacturing the MOSFET of Present Invention Example 3 were performed under the following conditions. That is, in the gate oxidation step (first heating step), silicon carbide substrate 10 was held for 60 minutes at a temperature of 1300° C. or more and 1400° C. or less in an atmosphere of 100% oxygen. In the nitriding step (second heating step), silicon carbide substrate 10 was held for 60 minutes at a temperature of 1300° C. or more and 1400° C. or less in an atmosphere of 100% nitrogen monoxide. In the argon annealing step (third heating step), silicon carbide substrate 10 was held for 60 minutes at a temperature of 1300° C. or more and 1400° C. or less in an atmosphere of 100% argon.

Stress was applied to the MOSFETs of Comparative Example 3 and Present Invention Example 3, to measure a stress application period and the amount of variation in threshold voltage. The amount of variation in threshold voltage is a value obtained by subtracting the threshold voltage before the stress application from the threshold voltage after the stress application. As the stress application, a gate voltage of −5 V to +5 V was applied to the gate electrode at a frequency of about 45 kHz, with the source voltage and the drain voltage being set to 0 V. The duty ratio was set to 1:1. The stress application period was set to up to 1000 hours.

Figure 15:
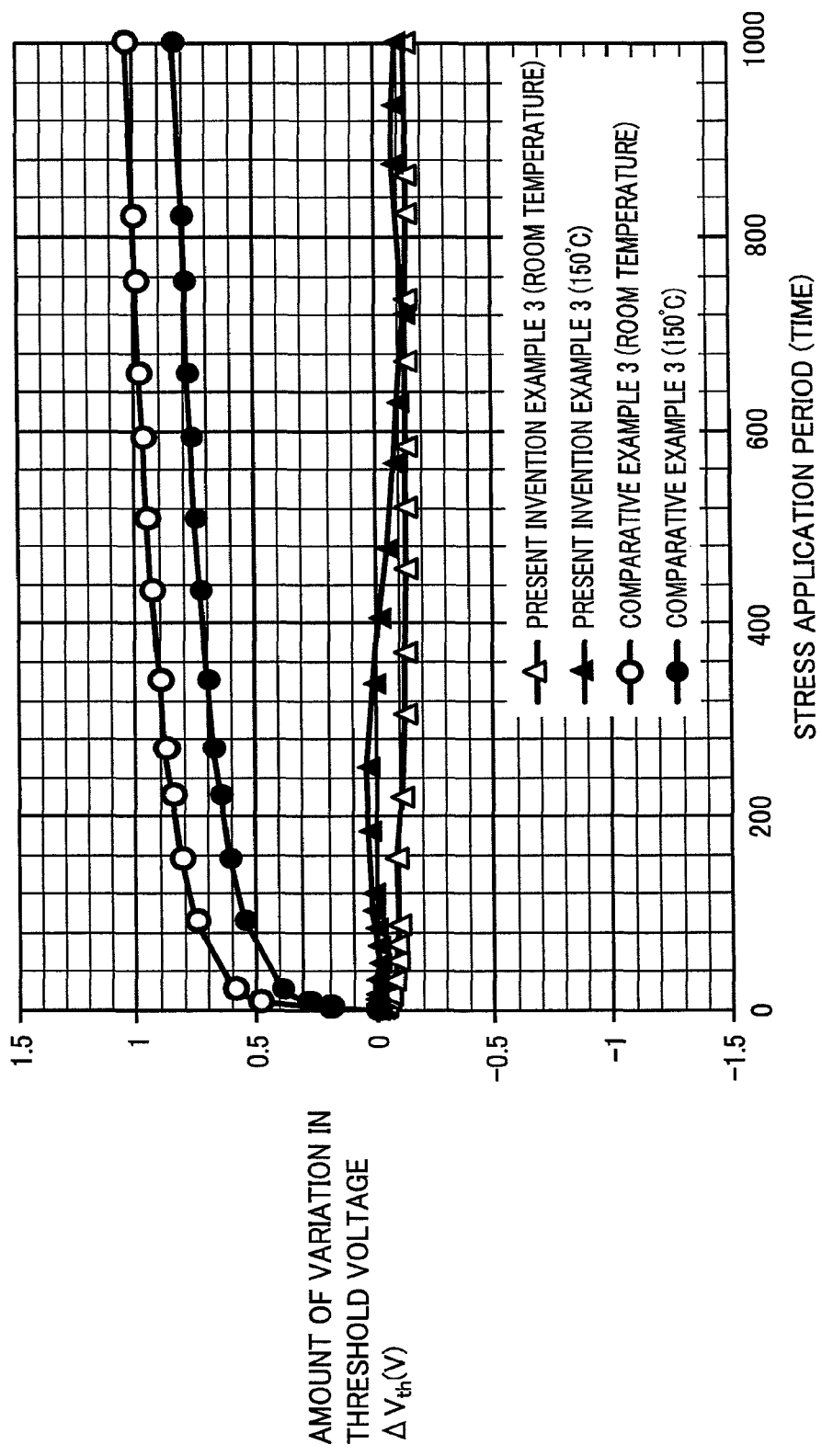
FIG. 15 shows relation between an amount of variation in threshold voltage and a stress application period.

Referring to FIG. 15, the relation between the amount of variation in threshold voltage (vertical axis) and the stress application period (horizontal axis) is described. Circle marks represent data in Comparative Example 3, and triangle marks represent data in Present Invention Example 3. Open marks represent data when the stress was applied at room temperature, and filled marks represent data when the stress was applied at 150° C.

As shown in FIG. 15, the amount of variation in threshold voltage of the MOSFET according to Present Invention Example 3 was smaller than the amount of variation in threshold voltage of the MOSFET according to Comparative Example 3. Moreover, in both Present Invention Example 3 and Comparative Example 3, the amount of variation in threshold voltage was smaller when the stress was applied at 150° C. than when the stress was applied at room temperature. Furthermore, it was confirmed that the amount of variation in threshold voltage of the MOSFET according to Present Invention Example 3 was 0.2 V or less when the stress application period was any period of time of 1000 hours or less.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide semiconductor device comprising:
   a silicon carbide substrate;
   an oxide film arranged in contact with said silicon carbide substrate;
   a gate electrode arranged in contact with said oxide film such that said gate oxide film is interposed between said gate electrode and said silicon carbide substrate; and
   a first electrode and a second electrode arranged in contact with said silicon carbide substrate,
   said first electrode and said second electrode being configured such that a current flowing between said first electrode and said second electrode can be controlled by a gate voltage applied to said gate electrode,
   the difference between a first threshold voltage of said silicon carbide semiconductor device that is measured for the first time and a second threshold voltage of said silicon carbide semiconductor device that is measured after stress has been applied to said silicon carbide semiconductor device continuously for 1000 hours is within ±0.2 V,
   the application of said stress being applying said gate voltage of 45 kHz varying from −5 V to +15 V to said gate electrode, with the voltage of said first electrode being 0 V and the voltage of said second electrode being 0 V.

2. The silicon carbide semiconductor device according to claim 1, wherein
   the difference between said first threshold voltage and a third threshold voltage that is measured after a lapse of any period of time of up to 1000 hours after the start of the application of said stress to said silicon carbide semiconductor device is within ±0.2 V.

3. The silicon carbide semiconductor device according to claim 1, wherein
   said stress is applied at a temperature of 150° C.

4. The silicon carbide semiconductor device according to claim 1, wherein
   the difference between said first threshold voltage and said second threshold voltage is within ±0.2 V when said stress is applied either at room temperature or at a temperature of 150° C.

* * * * *